(12) United States Patent
Lu et al.

(10) Patent No.: US 7,214,077 B2
(45) Date of Patent: May 8, 2007

(54) PRESS-FIT ASSEMBLING DEVICE

(75) Inventors: Li-Chin Lu, Guangdong (CN);
Gui-Qing Deng, Guangdong (CN)

(73) Assignees: Hong Fu Jin Precision Industry (Shen Zhen) Co., Ltd., Longhua Town, Bao'an District, Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/307,546

(22) Filed: Feb. 13, 2006

(65) Prior Publication Data
US 2006/0248711 A1    Nov. 9, 2006

(30) Foreign Application Priority Data
May 7, 2005    (CN)    ......................... 2005 2 0058106

(51) Int. Cl.
*H01R 13/62*    (2006.01)
(52) U.S. Cl. ...................................... 439/157; 439/331
(58) Field of Classification Search ................ 439/331, 439/157
See application file for complete search history.

(56) References Cited

U.S. PATENT DOCUMENTS

| | | | | | |
|---|---|---|---|---|---|
| 4,758,176 | A | * | 7/1988 | Abe et al. | ................... 439/331 |
| 5,326,271 | A | * | 7/1994 | Kishi et al. | ................... 439/72 |
| 5,609,497 | A | * | 3/1997 | Kawabe | ..................... 439/331 |
| 5,807,118 | A | * | 9/1998 | Tsubota | ..................... 439/73 |
| 6,025,732 | A | * | 2/2000 | Foo et al. | .................... 324/760 |
| 6,033,235 | A | * | 3/2000 | Ikeya | .......................... 439/71 |
| 7,101,209 | B2 | * | 9/2006 | Yates et al. | ................. 439/331 |

* cited by examiner

*Primary Examiner*—Michael C. Zarroli
(74) *Attorney, Agent, or Firm*—Winston Hsu

(57) ABSTRACT

A press-fit assembling device is provided to assemble enclosures including a chassis and a housing. The press-fit assembling device includes a base and a driver. The base includes a platform defined with a locating channel to secure the chassis located thereon. The driver is pivotally connected to one end of the base and is formed with a press plate. The press plate moves down under the control of the driver to press fit the housing and the chassis located on the platform. A plurality of stop blocks is arranged on the platform, and is used to prevent damage to the enclosure. The driver is also formed with a linkage set. When the press plate is lifted up, an aft part of the linkage set abuts against a cross rod and keeps the press plate from dropping down while the operator positions the chassis and housing for press-fitting.

8 Claims, 4 Drawing Sheets

PRESS-FIT ASSEMBLING DEVICE

TECHNICAL FIELD

The present invention relates to press-fit assembling devices, and particularly to a press-fit assembling device for products such as electronic enclosures.

RELATED ART

These days, electronics technology advances continuously, and many kinds of electronic devices are being developed to satisfy people's daily needs. These electronic devices comprise various electrical and mechanical components, which are assembled together within an enclosure. Commonly, electronic enclosures include two parts, which are fitted together in the final step of assembly.

At the present time, many of the steps for assembling enclosures are done manually, which limits the quantity and quality of mass production of electronic devices. As assembling enclosures still relies largely on manual labor, the speed and quality of assembling is mainly dependent on the individual attributes (e.g., degree of experience) of the operators selected to assemble the enclosures. If the caliber of the operators is low or varies too much, the assembly process may be unduly time-consuming and result in low-quality enclosures. Further, operators are prone to fatigue when they perform too many manual operations over a long period, and this also reduces the speed and quality of assembly. The upshot is that labor-intensive processes are liable to result in low yield rates.

Accordingly, there is a need for a press-fit assembling device to alleviate labor intensive assembly processes, and thereby improve the speed and yield rate of assembly of products such as enclosures.

SUMMARY

A press-fit assembling device is provided. The press-fit assembling device comprises a base and a driver. The base includes a platform with a locating channel for securing objects. The driver is pivotally connected to one end of the base, and is formed with a press plate. The driver rotates and drives the press plate to move toward the base, to thereby press fit two separate objects into a unified assembly.

The base includes a plurality of stop blocks, which prevents the press plate from over-pressing the objects. The base also includes a spring group fastened under the platform to retard the speed of movement of the platform. The base further includes two arms fixed on a rear end thereof. The arms are spaced from each other a distance, and a rod is provided between the arms. The driver includes a linkage set. An aft part of the linkage set abuts against the rod, thereby keeping the press plate from dropping down after the press plate is lifted and before the operator is ready to secure the objects on the platform.

The base also includes a press pad, an ejector pad, and a lower press pad at a rear end. The press pad is secured with the ejector pad, and the lower press pad is secured below the ejector pad. The lower press pad is movably installed on a slide rail, and is on a different plane from an oblique block under the driver. When the press plate presses down on the objects, the lower press pad moves down together with the platform and then is on a same plane as the oblique block. The oblique block thus holds the lower press pad and drives the lower press pad to slide along the slide rail, thereby urging the ejector pad and the press pad to move toward the objects until the press pad reaches the objects.

As compared to manually assembling of enclosures, the use of the press-fit assembling device improves the assembly speed and yield rate of production of the enclosures.

Other advantages and novel features will become more apparent from the following detailed description when taken in conjunction with the accompanying drawings, in which:

DETAILED DESCRIPTION OF THE PREFERRED EMBODIMENT

Figure 1:
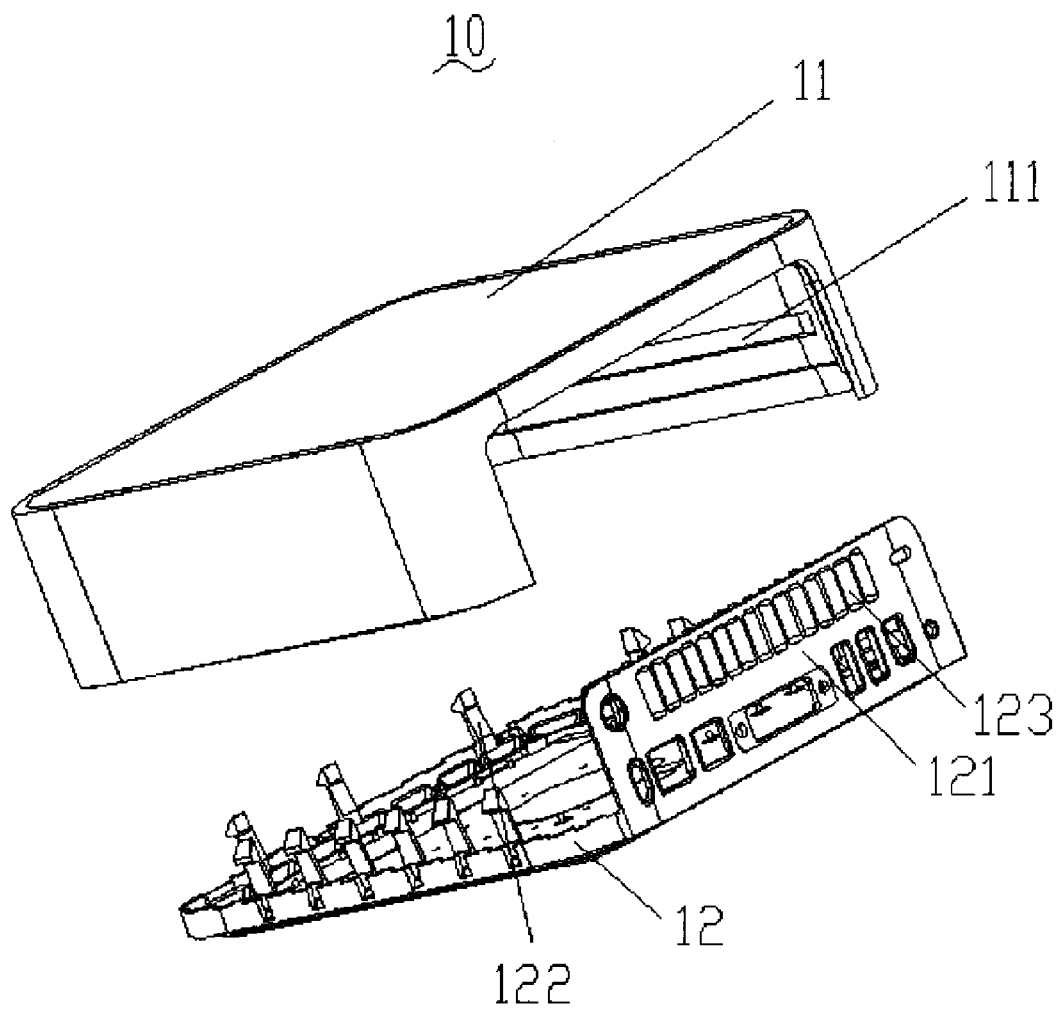
FIG. 1 is an isometric, pre-assembled view of a chassis and a housing of an enclosure which can be press-fit together by a press-fit assembling device of a preferred embodiment of the present invention.
Figure 2:
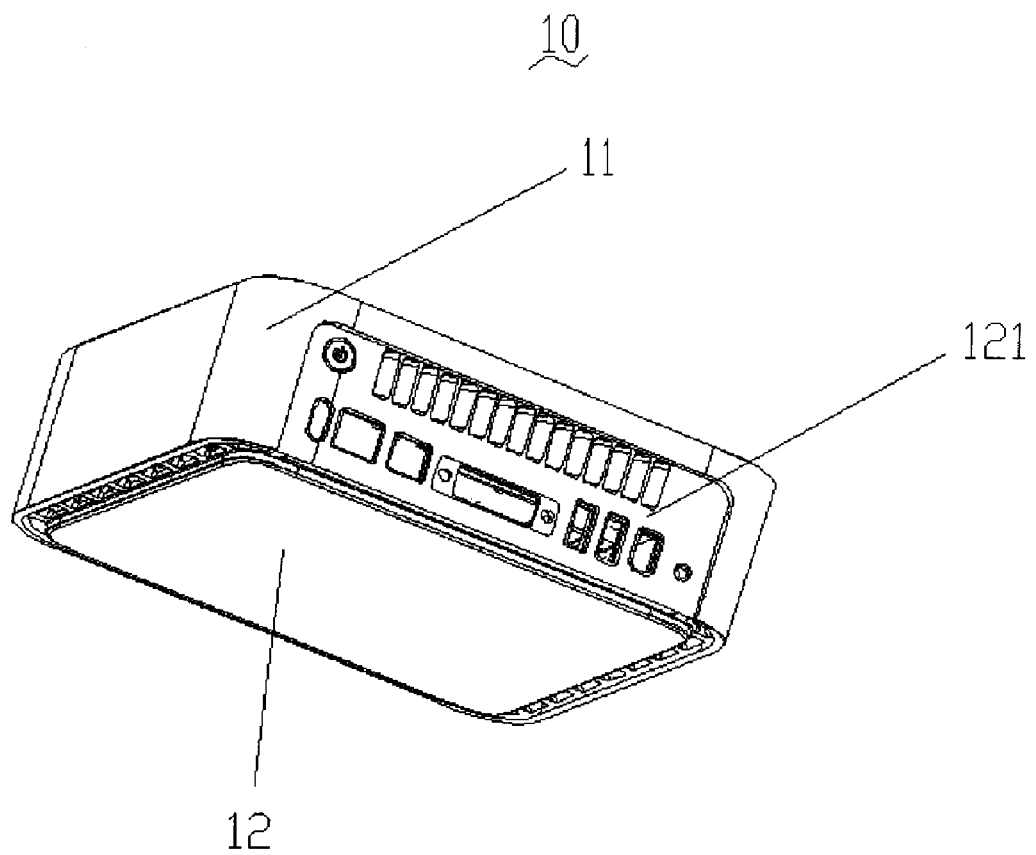
FIG. 2 is an assembled view of the enclosure of FIG. 1, but viewed from another aspect.

Referring to FIGS. 1 and 2, these show an enclosure that can be assembled by a press-fit assembling device of the preferred embodiment of the present invention. The enclosure 10 is typically a two-piece assembly including a chassis 12 and a housing 11. The chassis 12 and the housing 11 typically include internal interengaging detents, so that the chassis 12 and the housing 11 can be press-fit together to obtain the assembled enclosure 10. In the preferred embodiment, the detents are a plurality of hooks 122 formed on the chassis 12, and a U-shaped channel 111 defined in the housing 11 to engagingly receive the hooks 122. An interface panel 121 extends up from one end of the chassis 12. A plurality of radiating holes 123 is defined in the interface panel 121.

Figure 3:
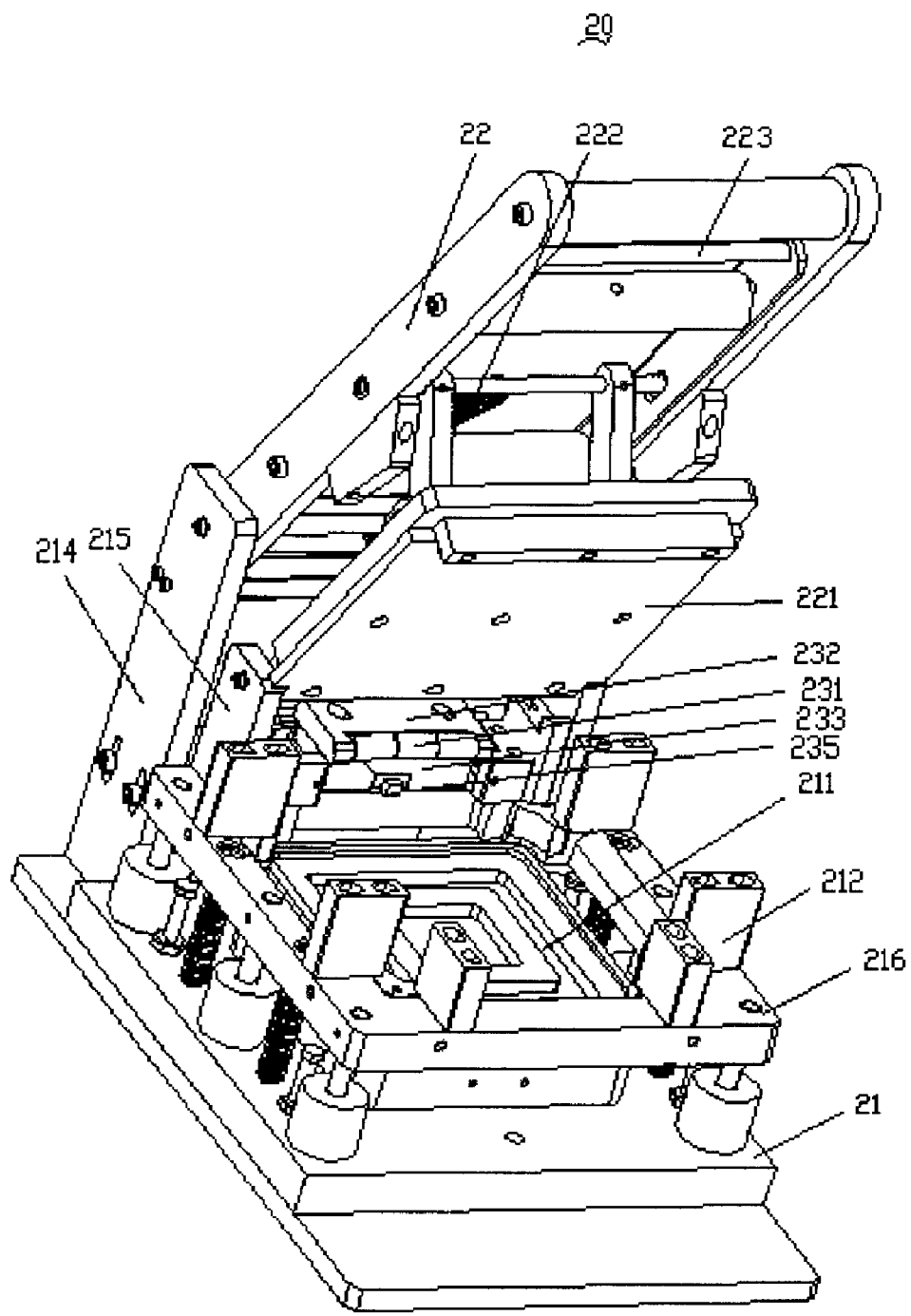
FIG. 3 is an isometric view of the press-fit assembling device in accordance with the preferred embodiment of the present invention.
Figure 4:
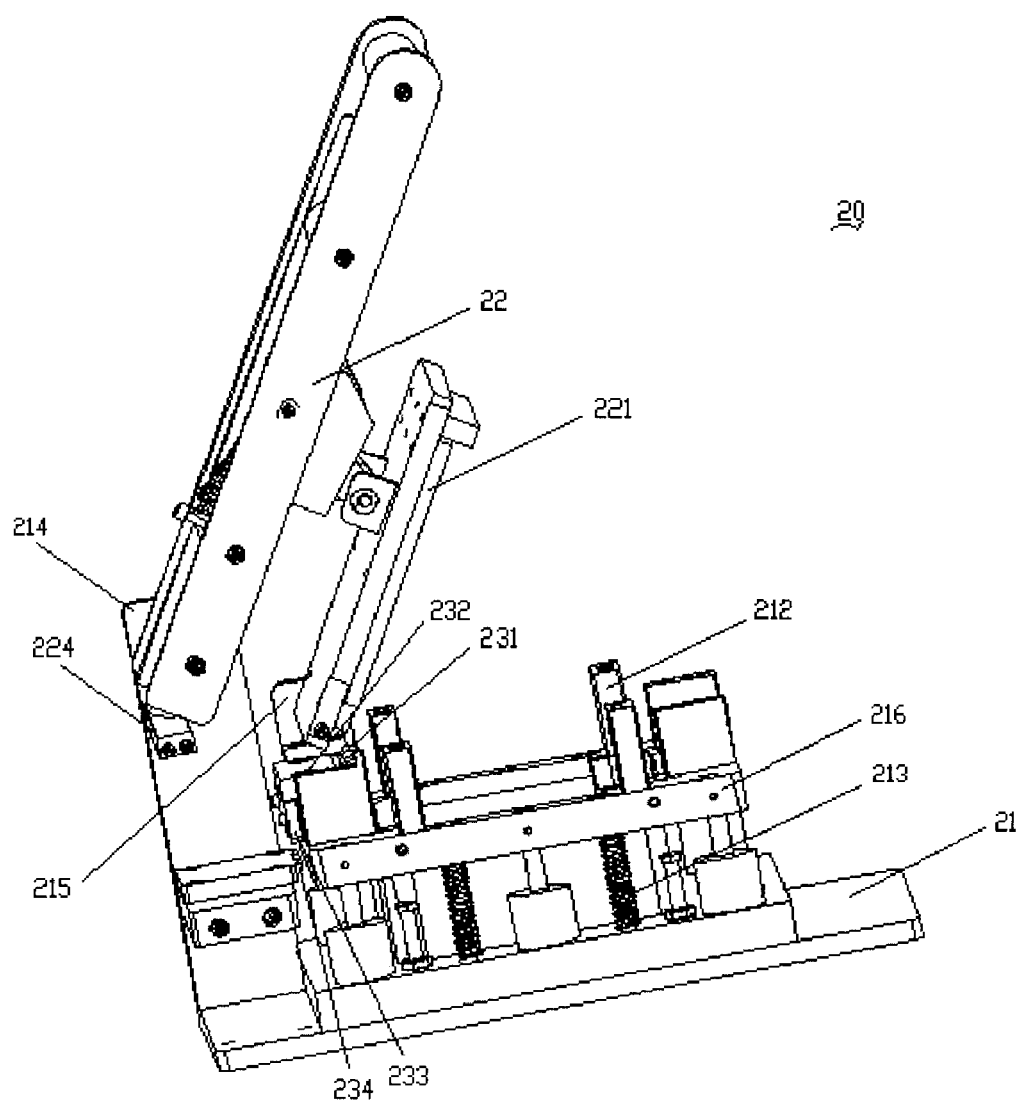
FIG. 4 is an isometric view of the press-fit assembling device shown in FIG. 3, but viewed from a side aspect and not showing certain parts of the press-fit assembling device.

Referring to FIGS. 3 and 4, these show a press-fit assembling device used to press fit the chassis 12 into the housing 11 and thereby form the assembled enclosure 10. The press-fit assembling device 20 includes a base 21, and a driver 22. The base 21 includes a locating channel 211 defined therein, for securing the chassis 12 on the base 21. The base 21 also includes two vertical, taller first arms 214 fixed on a rear end thereof. The base 21 further includes two vertical, shorter second arms 215 fixed on a rear end thereof in front of the first arms 214. The first arms 214 are spaced from each other a distance, and a cross rod 224 is connected between the first arms 214. A main part of the driver 22 is pivotally connected to the first arms 214. The driver 22 is formed with a press plate 221, a rear end of which is pivotally connected to the second arms 215. Therefore, with such configuration, and under the control of the driver 22, the press plate 221 rotates about top ends of the second arms 215 and moves down to press fit the housing 11 and the chassis 12 located on the base 21. In the preferred embodiment, the driver 22 also serves as a supporting frame, on which a linkage set 223 having a spring 222 is provided. An aft part of the linkage set 223 abuts against the cross rod 224 to keep the press plate 221 from dropping down after the press plate 221 has been lifted and before an operator is ready to press down the driver 22.

A plurality of stop blocks 212 are arranged along a fringe of a platform 216 located on the base 21. The stop blocks 212 are used to prevent over-pressing by the press plate 221 once the housing 11 is sufficiently combined with the chassis 12, thereby preventing damage to the enclosure 10. A plurality of springs (hereinafter referred to as a "spring group") 213 is fastened below the platform 216, to retard the speed of movement of the platform 216. Located at the rear end of the base 21 are a press pad 231, an ejector pad 232, and a lower press pad 233. The press pad 231 is secured with the ejector pad 232, and the lower press pad 233 is secured below the ejector pad 232. Further, the lower press pad 233 is movably installed on a slide rail 235, and is on a different plane from an oblique block 234 located generally between the first arms 214. When the press plate 221 presses down on the housing 11, the lower press pad 233 moves down together with the platform 216 and then is on a same plane as the oblique block 234. The oblique block 234 thus holds the lower press pad 233 and drives the lower press pad 233 to slide along the slide rail 235 to thereby urge the ejector pad 232 and the press pad 231 to move toward the enclosure 10. As a result, the press pad 231 reaches the interface panel 121 of the enclosure 10.

In use, the press plate 221 is lifted, and the aft part of the linkage set 223 abuts against the cross rod 224 of the driver 22 to hold the press plate 221 from dropping back down while an operator secures the chassis 12 on the locating channel 211 of the platform 216, with the interface panel 121 of the chassis 12 at the rear end of the base 21. Then, the operator positions the housing 11 over the chassis 12. After the chassis 12 and the housing 11 have been correctly positioned, the operator rotates the driver 22 to urge the press plate 221 toward the housing 11, thereby press fitting the housing 11 and the chassis 12 together. During the above-mentioned process, when the press plate 221 reaches the housing 11, the platform 216 receives and transmits the pressure from the press plate 221 to the spring group 213. Consequently, the spring group 213 is compressed and the lower press pad 233, as well as the platform 216, moves down. Thus the lower press pad 233 is located on a same plane as and is held by the oblique block 234. The lower press pad 233, the ejector pad 232, and the press pad 231 are urged by the oblique block 234 to slide toward the enclosure 10 along the slide rail 235 until the press pad 231 reaches the interface panel 121.

Accordingly, the press pad 231 presses the interface panel 121 to obtain a tightly assembled enclosure 10. Further, when the housing 11 and the chassis 12 have been press-fit sufficiently, the stop blocks 212 provided on the base 21 stop the press plate 20 from over-pressing the housing 11, thereby avoiding damage to the enclosure 10. Therefore, as compared to manually assembling enclosures, the use of the press-fit assembling device 20 improves the assembly speed and the yield rate of production of plural enclosures 10.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of type and arrangement of components within the principles of the invention to the full extent indicated by general meaning of the terms in which the appended claims are expressed and equivalents thereof.

What is claimed is:

1. A press-fit assembling device, comprising:
    a base comprising;
        a locating channel for securing one or more objects thereat;
        a press pad, an ejector pad, and a lower press pad disposed at one end of the base, the press pad being secured with the ejector pad and the lower press pad being secured below the ejector pad;
    a driver pivotally connected to said one end of the base and comprising a press plate;
    wherein, the driver rotates and drives the press plate to move toward the base, in order to press fit two or more objects into an assembly.

2. The press-fit assembling device according to claim 1, wherein the base further comprises a platform in which the locating channel is defined.

3. The press-fit assembling device according to claim 2, wherein the base further comprises a spring group fastened under the platform to retard a speed of movement of the platform.

4. The press-fit assembling device according to claim 1, wherein the base further comprises a plurality of stop blocks for preventing the press plate from over-pressing the objects.

5. The press-fit assembling device according to claim 1, wherein the base further comprises two arms located at said one end thereof, the arms being spaced from each other a distance.

6. The press-fit assembling device according to claim 5, wherein the base further comprises a rod secured between the arms.

7. The press-fit assembling device according to claim 6, wherein the driver further comprises a linkage set, the linkage set having an aft part, and the aft part abuts against the rod, thereby keeping the press plate from dropping down while an operator is securing the objects at the base.

8. The press-fit assembling device according to claim 1, wherein the lower press pad is movably installed on a slide rail and is on a different plane from an oblique block under the driver, the lower press pad moves down together with the platform and then is on a same plane as the oblique block as the press plate presses down on the objects, and the oblique block thus holds and urges the lower press pad to slide along the slide rail, thereby driving the ejector pad and the press pad to move toward the objects until the press pad reaches the objects.

* * * * *